(12) United States Patent
MacDonald et al.

(10) Patent No.: US 6,489,797 B1
(45) Date of Patent: Dec. 3, 2002

(54) TEST SYSTEM INCLUDING A TEST HEAD WITH INTEGRAL DEVICE FOR GENERATING AND MEASURING OUTPUT HAVING VARIABLE CURRENT OR VOLTAGE CHARACTERISTICS

(75) Inventors: Bruce MacDonald, Hanover; Philip Perkins, Needham, both of MA (US)

(73) Assignee: LTX Corporation, Westwood, MA (US)

( * ) Notice: Subject to any disclaimer, the term of this patent is extended or adjusted under 35 U.S.C. 154(b) by 0 days.

(21) Appl. No.: 09/354,411

(22) Filed: Jul. 15, 1999

(51) Int. Cl.[7] .................. G01R 31/26; G01R 31/02
(52) U.S. Cl. ..................... 324/765; 324/158.1
(58) Field of Search .................. 324/765, 754, 324/158.1, 755, 758, 760

(56) References Cited

U.S. PATENT DOCUMENTS 5,973,504 A * 10/1999 Chong .................. 324/754

* cited by examiner

*Primary Examiner*—Safet Metjahic
*Assistant Examiner*—J Kerveros
(74) *Attorney, Agent, or Firm*—McDermott, Will & Emery

(57) ABSTRACT

A test system for testing at least one electrical component includes a test head having a mounting assembly for removably attaching the electrical component, and a plurality of test ports for electrically coupling to the electrical component. The test system further includes a voltage and current source located within the test head. The voltage and current source is constructed and arranged so as to provide at least one electrical output, through an interface assembly, to the electrical component. The electrical output has a voltage magnitude within a predetermined voltage range and has a current magnitude within a predetermined current range. The voltage and current source further analyzes the electrical output so as to detect and measure one or more changes to the electrical output caused by the electrical component. The voltage and current source also receives and analyzes a plurality of response signals through the interface assembly from the signal ports of the electrical component. The electrical output is characterized by a plurality of transitions and a predetermined repetition rate between consecutive the transitions.

27 Claims, 7 Drawing Sheets

TEST SYSTEM INCLUDING A TEST HEAD WITH INTEGRAL DEVICE FOR GENERATING AND MEASURING OUTPUT HAVING VARIABLE CURRENT OR VOLTAGE CHARACTERISTICS

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

BACKGROUND OF THE INVENTION

The present invention relates to devices for generating and measuring electrical outputs, and more particularly, to voltage and current sources for generating and measuring electrical outputs having variable current and/or voltage characteristics, wherein the outputs are provided to electrical devices being evaluated by a testing system.

A testing system for testing electrical devices such as integrated circuits typically includes a test head connected to a mainframe system by a section of cable. The test head may also be mounted to a manipulator arm to provide a mechanical advantage to assist the user in moving the test head. The device under test (hereinafter referred to as "DUT") mounts on test head such that electrical leads of the DUT are electrically coupled to corresponding test leads of the test head. In general, the mainframe system evaluates the DUT by providing a variety of signals to the DUT and evaluating how the DUT responds to those signals. It is also useful to ascertain how the DUT alters the signals provided by the mainframe system, especially for test signals whose voltage and/or current characteristics exhibit a wide dynamic range. For example, the mainframe system may arrange to provide a 5 volt test signal to an input of the DUT, then evaluate the state of the DUT output signals, along with the current draw of the DUT on that 5 volt test signal. How the DUT alters the test signal can provide significant information regarding the functionality of the DUT. In some test situations, a DUT may require a particular voltage or current input in addition to the control signals. For example, a semiconductor switch may be used to control the flow of a relatively large amount of current for a motor or other high current sink. Such a semiconductor switch may not only include control inputs and diagnostic outputs, but also an input that receives the relatively large electrical flow from a high power source, and an output that directs the electrical flow to the current sink. When the DUT includes this sort of device, the test system must not only supply low level control signals, but also higher power inputs.

In many prior art test systems, all such test signals between the mainframe system and the test head must travel via the section of cable connecting them. The testing system also generally supplies operating power to the DUT. Many such systems include DUT power supplies in the mainframe so that power delivered to the DUT travels through the cable. During the testing procedure, advanced, state-of-the-art DUTs often transition from a standby mode to an active mode, such that the DUT current draw can vary by a factor of 500 or more (e.g., 0.02 A to 10 A). These DUT power transitions can occur in just a few clocks cycles, which translates to a large current slew rate. Hereinafter, the term "voltage and current source" is used to generally describe a power supply (i.e., a continuous power source), a relatively high capacity voltage and current source (i.e., a pulsed power source, such as that described above for driving a semiconductor switch). In prior art systems, these two functions are typically implemented by two individual components because of the unique nature of each of the functions, thus affecting the size, power requirements, cost and reliability of the overall test system.

To provide convenient access to the DUT, as well as relatively free manipulation of the entire test head, the section of cable between the test head and the electrical instruments residing within the mainframe may be in excess of ten feet. A long cable corresponds to large series inductance, which introduces a low pass filter (hereinafter referred to as "LPF") between the power supply and the DUT. The LPF created by the cable removes high frequency components, so that the transition edges of signals transmitted via the cable are effectively slowed. Thus, the practical consequence of the cable being between the test head and the mainframe is that the DUT does not receive a true representation of the signal that the mainframe generates. In prior art systems, the location of the voltage and current source, especially one having a wide dynamic range (with respect to voltage and/or current; e.g., current transitions from microamps to amps), is generally irrelevant, because the bandwidth (hereinafter referred to as "BW") of most such devices isn't high enough to be limited by the LPF. In other words, typical prior art voltage and current sources simply can't keep up with the current transition requirements of modem DUTs, so no motivation exists for placing such a device closer to the DUT.

Some prior art systems include a voltage and current source at an intermediate location between the mainframe and the test head, often somewhere nearer to the test head than the mainframe. A cable connecting the voltage and current source to the test head is present, but it is typically significantly shorter than the ten feet as described above. Although such sources are specifically designed for higher bandwidth, the cable still imposes limitations on the test signal transitions.

There are a number of factors that have traditionally discouraged mounting voltage and current sources within a test head, nearer to the DUT, thus reducing the intervening cable length. One of these factors includes cooling considerations. A voltage and current source capable of providing the amount of power that the DUT requires typically dissipates a significant amount of heat. This dissipated heat adversely affects the DUT, along with the associated electronics, if the heat is not efficiently removed from the test head. Traditional, air based cooling systems are generally not efficient enough to remove this heat, so designers often locate these power supplies outside of the test head.

Another factor discouraging voltage and current source in the test head is that a power supply capable of providing the amount of power that the DUT requires typically occupies a significant amount of physical space. This is especially true for linear mode power supplies, which are often used for DUT supplies because of the high quality regulation they provide. Thus, designers typically conserve test head space by locating the DUT power supply outside of the test head. Until very recently, the current input requirements of integrated electrical devices have been relatively modest, typically within a few amps. As more functionality is added and clock rates increase, the current input requirements of integrated electrical devices are increasing dramatically. Such high capacity continuous current and voltage sources are typically physically large, and so can not be included in the limited space of a test head. In some applications, large, continuous output voltage and current sources are used for their high output capability, even though the nature of the application does not require a continuous output. Further, a relatively recent practice is to design integrated electrical devices with integrated semiconductor power switches. Thus, such a device requires the same high current output source that a stand-alone semiconductor switch (described herein) requires.

Another factor weighing in favor of locating the voltage and current source outside of the test head is essentially organizational in nature. The group that tests highly integrated very large scale integration (hereinafter referred to as VLSI) digital devices is usually physically separate from the mixed signal test group. Although the VLSI group often encounters the aforementioned fast transition problem, they do not have the analog expertise to solve the problem. Conversely, although the mixed signal group possesses the expertise to solve such a problem, they are typically not aware of the problem.

A category of prior art voltage and current sources can provide a predetermined output profile in terms of voltage, current, or a combination thereof. However, a disadvantage of such existing voltage and current sources is a significant lack of precise control over characteristics of the output profile, e.g., timing. Such prior art sources cannot be digitally synchronized precisely to other events occurring in the host system.

Further, prior art voltage and current sources located within the test head do not provide means of direct repetitive sampling of the output signals (e.g., current and voltage). Typically a user can accomplish repetitive sampling only by placing a suitable external measurement device at the voltage and current source output and sampling the output at predetermined intervals.

It is an object of the present invention to substantially overcome the above-identified disadvantages and drawbacks of the prior art.

SUMMARY OF THE INVENTION

The foregoing and other objects are achieved by the invention, a test system for testing at least one electrical component, comprising a test head that includes a mounting assembly for removably attaching the electrical component, and a plurality of test ports for electrically coupling to the electrical component. The test system further includes a voltage and current source being disposed within the test head, constructed and arranged so as to provide at least one electrical output, through an interface assembly, to the electrical component. The electrical output has a voltage magnitude within a predetermined voltage range and has a current magnitude within a predetermined current range. The voltage and current source further analyzes the electrical output so as to detect and measure one or more changes to the electrical output caused by the electrical component. The voltage and current source also receives and analyzes a plurality of response signals through the interface assembly from the signal ports of the electrical component. The electrical output is characterized by a plurality of transitions and a predetermined repetition rate between consecutive the transitions.

In another embodiment of the invention, the transitions include current transitions.

In another embodiment of the invention, the transitions include voltage transitions.

In another embodiment, the voltage and current source is disposed substantially adjacent to the electrical component, so as to minimize a length of the power interface assembly.

In another embodiment, the power interface assembly includes a cable assembly.

In another embodiment, the power interface assembly includes a printed circuit board assembly.

In another embodiment of the invention, the power supply is cooled by a liquid-based cooling system.

In another embodiment, the electrical output provided by the voltage and current source is characterized by an output profile with respect to time.

In another embodiment, the output profile includes variations in an output current.

In another embodiment, the output profile includes variations in an output voltage.

In another embodiment of the invention, a sequencer controls the electrical output such that the power output profile includes a contiguous series of discrete steps.

In another embodiment, the sequencer is initiated by an external trigger source from an associated control system, synchronous to a master reference clock.

In another embodiment, the sequencer controls an amplitude and a duration of each of the discrete steps.

In another embodiment of the invention, the sequencer includes a plurality of output profiles, one of which is selected by an associated control system.

In another embodiment, the test system further includes a measurement output for providing an electrical measurement signal representative of a characteristic of the electrical output.

In another embodiment, the electrical output is periodically sampled at a sampling rate, such that the electrical measurement signal includes a sequence of digital words.

In another embodiment, the voltage and current source is electrically coupled to a mainframe system such that the voltage and current source functions as a remote extension of the mainframe system, and the mainframe system originates the electrical output, analyzes the electrical output, and analyzes the response signals.

In another embodiment, the voltage and current source includes an energy storage element, wherein the voltage and storage source directs energy from the storage element to the at least one electrical output.

In another embodiment, the energy storage element is subdivided into a first portion and a second portion. The first portion resides within the test head and the second portion resides outside of the test head.

In another aspect of the invention, a test system for providing a repetitive, predetermined signal waveform to an electrical component comprises a sequencer constructed and arranged to produce a time varying control signal, corresponding to the predetermined signal waveform, as a result of an input trigger signal. The test system further includes a voltage and current source constructed and arranged to produce an electrical output that is a predetermined function of the control signal. The voltage and current source is electrically coupled to the electrical component so as to deliver the electrical output to the electrical component.

In another embodiment of the invention, the predetermined signal waveform includes a predetermined sequence of current transitions, so as to establish a contiguous series of current steps.

In another embodiment, the predetermined signal waveform includes a predetermined sequence of voltage transitions so as to establish a contiguous series of voltage steps.

In another embodiment, the sequencer is initiated by an external trigger source from an associated control system, synchronous to a master reference clock.

In another embodiment, the sequencer controls an amplitude of the predetermined signal waveform and a duration of each of a plurality of step intervals within the signal waveform.

In another embodiment, the sequencer includes a plurality of predetermined signal waveforms, one of which is selected by an associated control system.

In another embodiment, the test system further includes a measurement output for providing an electrical measurement signal representative of a magnitude of the predetermined signal waveform.

In another embodiment, the predetermined signal waveform is periodically sampled at a sampling rate, such that the electrical measurement signal includes a sequence of digital words.

BRIEF DESCRIPTION OF DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENTS

Figure 1:
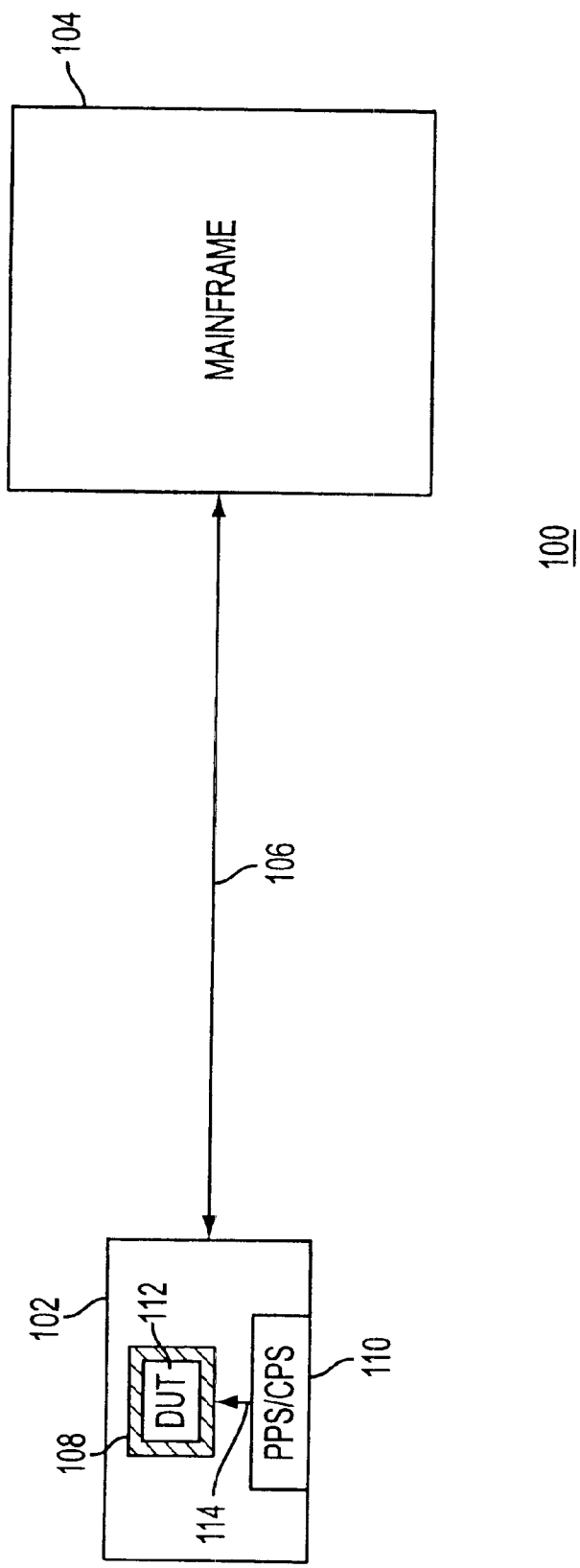
FIG. 1 shows a block diagram view of one preferred embodiment of a test system for testing electrical components.

FIG. 1 shows a block diagram view of one preferred embodiment of a test system 100 for testing electrical components. The test system 100 includes a test head 102, a mainframe system 104, and a cable assembly 106 that electrically couples the test head 102 to the mainframe system 104. The test head further includes a mounting assembly 108 and a device that functions as a pulsed power source and a continuous power source (hereinafter referred to as "PPS/CPS") 110 for supplying local operating power to a device under test (hereinafter referred to as "DUT") 112. The component referred to as the PPS/CPS 110 in this description performs two general functions; a "PPS" function and a "CPS" function.

The PPS portion of the PPS/CPS 110 provides a voltage and current output signal that varies in current magnitude, voltage magnitude or both. The PPS portion may operate in a "force current—measure voltage" mode, in which the current output is the controlled parameter and the voltage, the characteristics of which are dependent on the DUT, is merely measured. Alternately, the PPS portion may operate in a "force voltage—measure current" mode, in which the voltage is the controlled parameter and the current (dependent on the DUT) is measured. Note that in either of the aforementioned modes, the PPS/CPS 110 may also measure the controlled parameter along with the associated dependent parameter. The primary purpose of the PPS portion of the PPS/CPS 110 is to provide an electrical output, at a particular voltage or current, for a short period of time. This short-lived electrical output may constitute a single test element of a comprehensive DUT test procedure, and may be repeated at a test interval with different voltage or current characteristics. An advantage to using a PPS to drive a DUT is that the pulsed nature of the PPS tends to minimize DUT self heating, especially for test procedures that require high current magnitudes to the DUT.

The CPS portion of the PPS/CPS 110 provides a traditional power supply function to the DUT, e.g., a digital $V_{cc}$ input. The primary purpose of the CPS portion of the PPS/CPS 110 is to maintain a consistent $V_{cc}$ input to the DUT, as the load that the DUT presents to the PPS/CPS 110 varies over the entire testing procedure. The PPS/CPS 110 thus reduces the size of the energy storage device (i.e., bypass capacitor) that must be placed at the $V_{cc}$ input to the DUT.

The dynamic range of the output from the PPS/CPS 110 is large relative to many similar prior art devices. The PPS/CPS 110 also measures and conveys characteristics such as current, voltage or both, of the PPS/CPS output. The mounting assembly 108 functions to mechanically secure, and electrically couple to, the DUT 112. Although only one DUT 112 is shown in the exemplary embodiment shown in FIG. 1, other embodiments may have provisions for mounting two or more DUTs onto the test head 102., the test head 102 may further include measurement electronics such as amplifiers, filters, multiplexers, data storage devices, etc., for processing the data to and from the DUT 112, although these features are not explicitly shown in the exemplary embodiment of FIG. 1.

The mainframe system 104 evaluates the DUT 112 by generating stimulating signals and transmitting these signals to the test head 102 via the cable assembly 106, and ultimately to the DUT 112. The stimulating signals cause the DUT 112 to generate response signals, which the mainframe system 104 receives via the cable assembly 106. The mainframe system 104 analyzes the response signals with respect to the stimulating signals to determine the performance parameters of the DUT 112. In many cases, the dynamic range of the stimulating signal is too large to be directly generated by the mainframe system 104 over the cable assembly 106. In such cases, the mainframe system 104 provides the stimulating signal indirectly via the PPS/CPS 110.

The PPS/CPS 110 receives commands from the mainframe system 104 and provides a corresponding output to the DUT 112 via an interface assembly 114. The interface assembly 114 may include a cable, a wiring harness, printed circuit traces, or other electrical coupling methods known to those in the art. In a preferred embodiment, the PPS/CPS 110 is arranged adjacent to the DUT 112 so as to minimize the length (and thus the inductance) of the interface assembly 114.

The PPS/CPS 110 provides a voltage and current output that exhibits substantial dynamic range, rapid transitions, and substantially wideband spectral characteristics in general (e.g., high repetition rates of the current and/or voltage transitions). These characteristics attributed to the PPS/CPS 110 output may apply to the output signal voltage, the output signal current, or both. For example, one preferred embodiment of the PPS/CPS 110 can vary the output current from a few mA to approximately 10A in approximately 1 $\mu$S, although alternate embodiments can exhibit other ranges commensurate with relevant DUT technologies. The PPS/CPS 110 can effect consecutive transitions such that the time between transitions is on the order of 4 $\mu$S. Although the PPS/CPS 110 preferably produces output variations by varying the output current, other embodiments can vary the power output by varying the output voltage, or by varying a combination of the output current and the output voltage.

The test system 100 further includes a cooling system that moves heat dissipated by the PPS/CPS 110 during operation from the region of the test head 102. The cooling system is included so that the dissipated heat does not significantly increase the temperature within the test system, and thereby degrade the operation of the DUT 112 or any peripheral measurement electronics in the test head 102. A preferred embodiment of the test system 100 includes a closed, liquid based cooling system known to those in the art, wherein a cooled liquid passes through a heat exchanger that is in thermal contact with the PPS/CPS 110. Alternate embodiments of this invention may incorporate other types of cooling systems known in the art, such as convection, conduction, electro-thermal techniques, etc.

Figure 2:
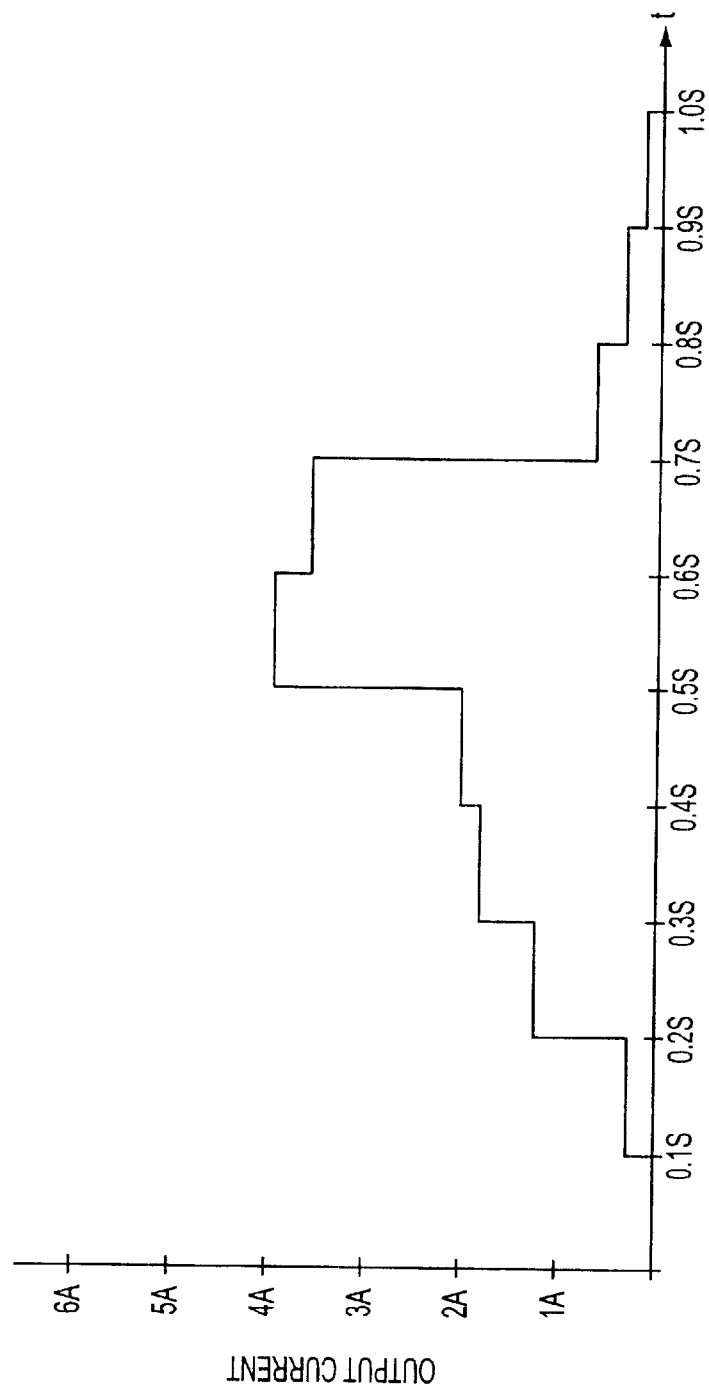
FIG. 2 illustrates an exemplary electrical power output profile from the power supply shown in FIG. 1.

In one preferred embodiment, the PPS/CPS 110 produces an electrical output that is characterized by a signal waveform with respect to time. FIG. 2 illustrates an exemplary output waveform 120 from the PPS/CPS 110. In this example, the waveform 120 includes discrete, equal periods of constant current output. Other embodiments of the invention may include waveforms of discrete, equal periods of voltage output, waveforms having unequal periods of current or voltage, or waveforms that are a continuously varying function of time. Preferably, the PPS/CPS 1 10 controls either the voltage or current characteristic of the PPS/CPS 110 signal output, while the DUT dictates the corresponding current or voltage characteristic, respectively, as a result of the controlled characteristic.

Figure 3:
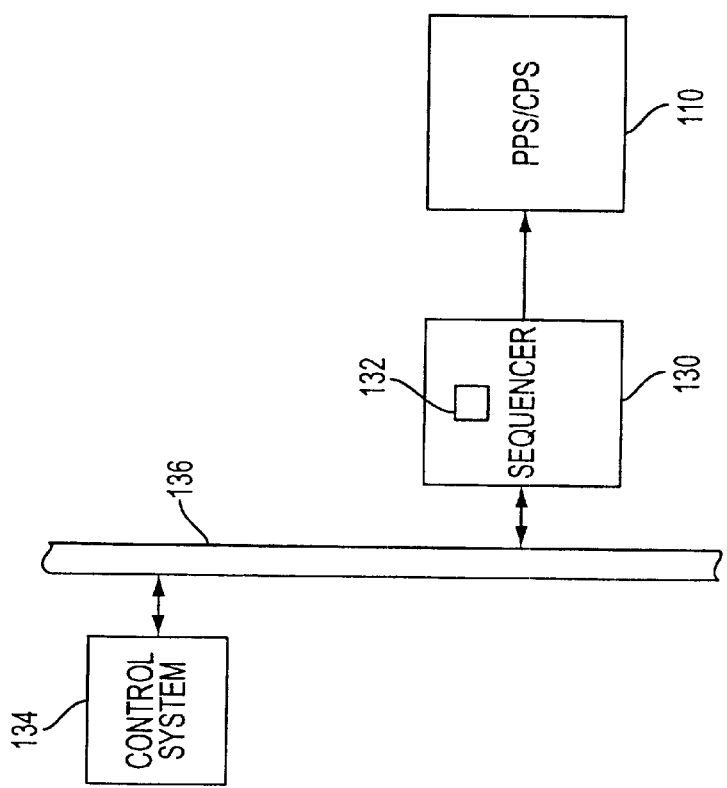
FIG. 3 shows a sequencer driving the power supply shown in FIG. 1.

In one embodiment of the invention, the waveform 120 derives from a sequencer 130 that drives the PPS/CPS 110 as shown in FIG. 3. The PPS/CPS 110 receives a series of commands from sequencer 130, where each command corresponds to a unique state of the PPS/CPS 110 voltage and current output. The commands preferably include digital words, but analog signals may also be used. The sequencer 130 preferably includes a store 132 of different waveforms that may be selected by a control system 134 via an interface bus 136. In operation, the control system 134 provides a selection word along with a trigger via the interface bus 136. The selection word selects which of the waveforms in the store 132 the sequencer should use, and the trigger begins the waveform. The interface bus 136 is constructed such that the trigger from the control system 134 begins the sequencer synchronous to a master reference clock, thus providing precise control of the PPS/CPS 110 signal output, preferably to within one clock cycle of the master clock.

In one embodiment of the invention, the PPS/CPS 110 further includes a measurement output that provides an electrical measurement signal representative of a magnitude of the PPS/CPS 110 output. The electrical measurement signal is preferably generated by sampling the PPS/CPS 110 output at a periodic sampling rate, so that the measurement signal is a sequence of digital words. The digital words may also be conveyed to the mainframe system 104 via an internal data network that is preferably part of the same internal data network that includes the interface bus 136. The electrical measurement signal may be representative of the output power, output voltage or output current, all of which may be sensed and converted for a form suitable to sampling by components well known to those in the art.

Figure 4:
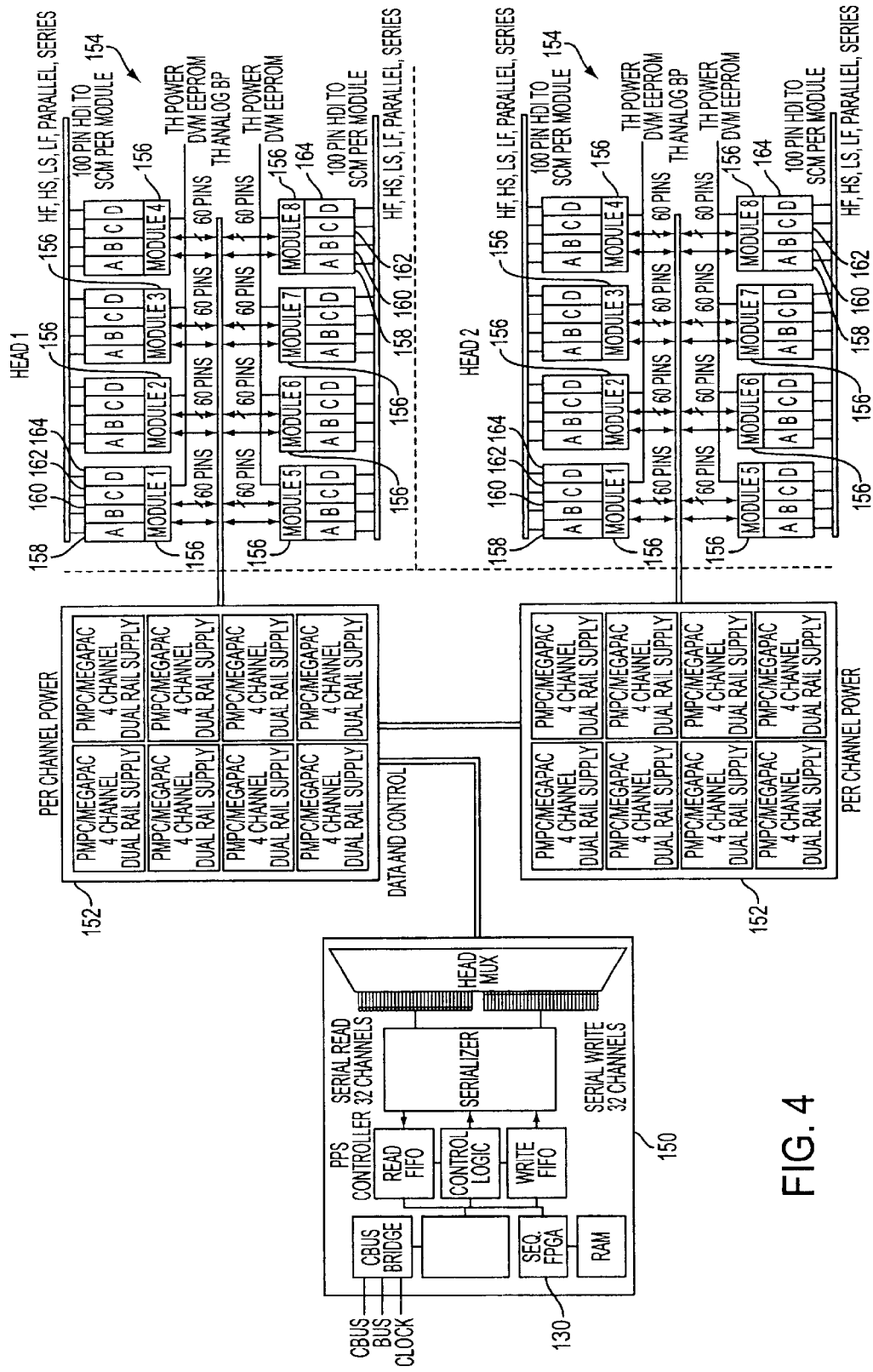
FIG. 4 shows a block diagram of one preferred embodiment of the PPS/CPS.

FIG. 4 shows a block diagram of one preferred embodiment of the PPS/CPS 110, which includes a controller subassembly 150, a rail power supply subassembly 152 for each test head, and a head module amplifiers subassembly 154 for each test head. In this embodiment, the head module amplifiers 154 include eight identical modules 156, and each module 156 includes four a independent channel drivers 158, 160, 162 and 164. Thus, each head module amplifier 154 can produce 32 independent voltage and current outputs. Each of the channels 158, 160, 162 and 164 of each of the modules 156 can produce either a PPS type function or a CPS type function, as described herein, depending upon the control information that the controller subassembly 150 provides to the head module amplifier 154. The sequencer 130 that produces a voltage and current waveform 120 as described via FIG. 3 is implemented within the controller subassembly 150 of this embodiment. Each of the 32 voltage and current outputs are floating with respect to a common system ground potential, which allows series connection of individual voltage and current channel outputs so that the total series connected output voltage is the sum of the individual channel outputs. Further, the individual current and voltage output channels include provisions for communicating among one another, so that the individual output channels can current share equally when connected in parallel.

Figure 5:
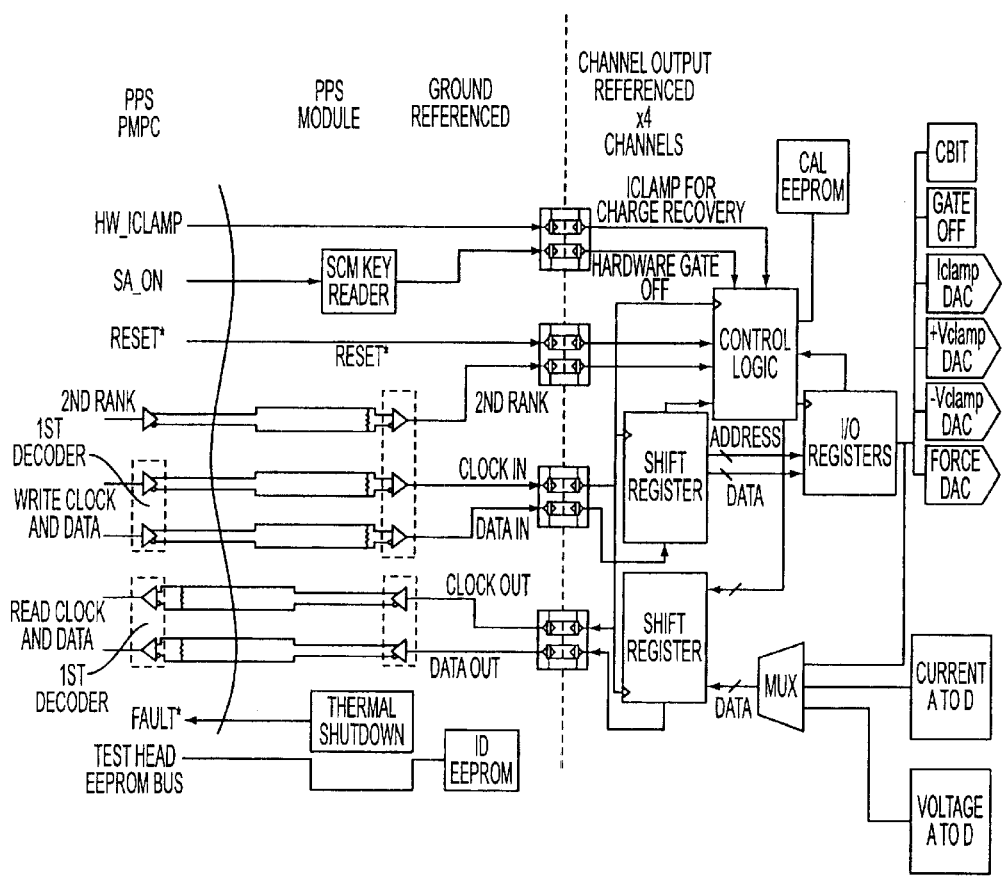
FIG. 5 illustrates the primarily digital aspects of the head amplifier.
Figure 6:
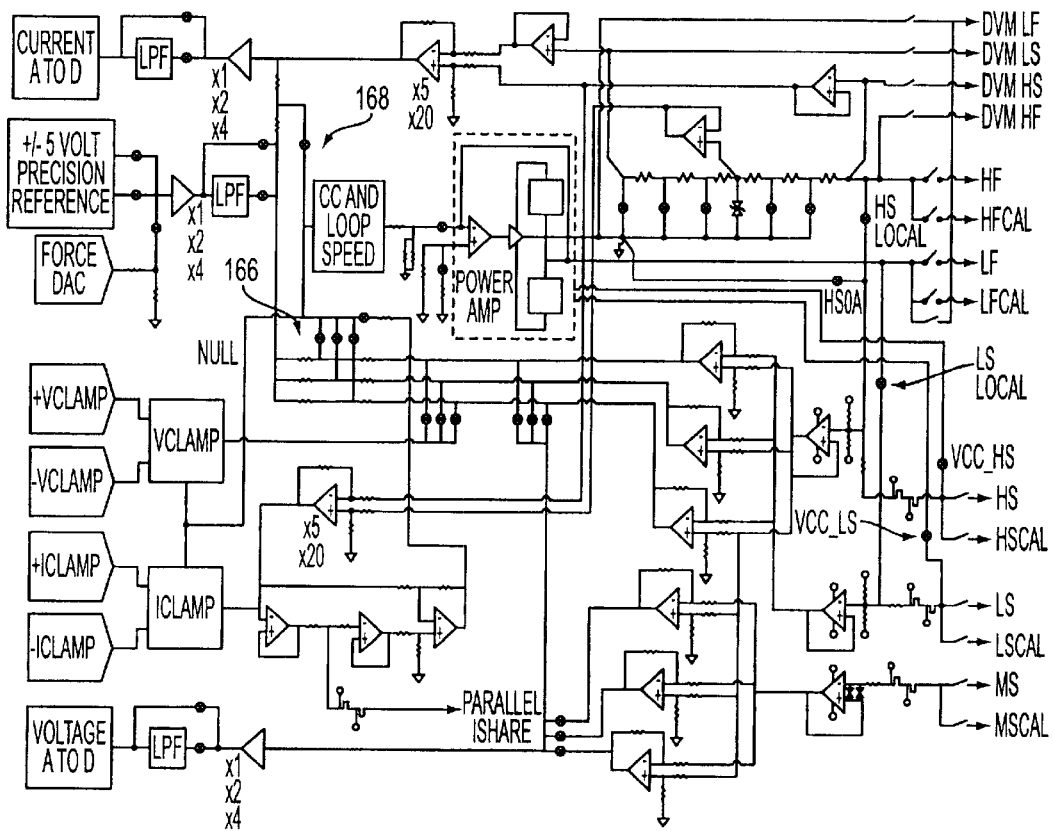
FIG. 6 illustrates the primarily analog aspects of the head amplifier.
Figure 7:
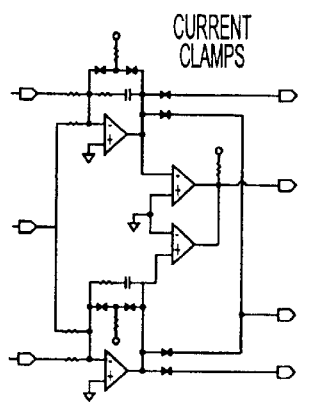
FIG. 7 illustrates the current clamping circuitry of the head amplifier.
Figure 8:
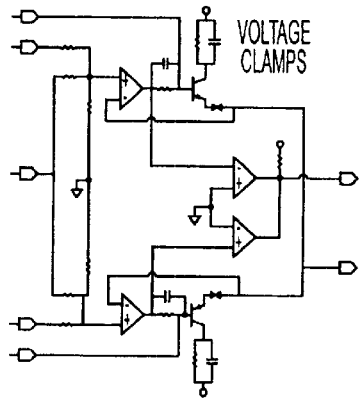
FIG. 8 illustrates the voltage clamping circuitry of the head amplifier.

The functionality of the head amplifier 154 is illustrated in FIGS. 5, 6, 7, and 8. FIG. 5 illustrates the primarily digital aspects of the head amplifier 154, including the data bus interface, isolation circuitry, serial-to-parallel data transfer and control circuitry, identification and calibration EEPROMs, cbits, and temperature sensing circuitry. FIGS. 6, 7, and 8 illustrate the analog aspects of the head amplifier 154, including the source/force and the measure functions. In normal operation, the head amplifier 154 input will be connected to the force DAC. During calibration, the amplifier input may be connected to a precision voltage reference. The current clamps shown in FIG. 7 and the voltage clamps shown in FIG. 8 constantly monitor the head amplifier 154 outputs. The clamps continuously function regardless of whether the system is in force-voltage mode, force current mode, or gated off In the case of a serious fault, current clamps override the voltage clamps.

The head amplifier 154 can measure voltage and current simultaneously with the two A to D converters as shown in FIGS. 5 and 6. When in the measure-current mode, the amplifier 154 senses the voltage developed across an ammeter resistor. Since the D to A converters and the A to D converters are all floating with the amplifier output, current can be measured accurately without any error due to output voltage. When in the measure-voltage mode, the amplifier 154 can sense either the differential voltage between high sense and low sense, or the differential voltage between high sense and the measure sense input. The supply voltages from the rail power supply subassembly 152 limit the input voltage range in either case.

The overall feedback loop provides accuracy at the output by differentially sensing errors at the output and applying corrections to the input. Four different circuits can take control of the overall feedback loop depending on the programmed mode and existing conditions, as follows. During the force-voltage mode, the FV analog switch 166 is on and the FI switch 168 is off. Feedback is provided from the differential voltage between high sense and low sense. High sense can be connected remotely, locally or to the amplifier output. Low sense can be connected remotely or locally. In force-current mode, the FI analog switch 168 is on and the FV switch 166 is off Feedback is provided from the differential voltage across the ammeter resistor. The loop can also be controlled by the voltage or current clamps of FIGS. 7 and 8.

Figure 9:
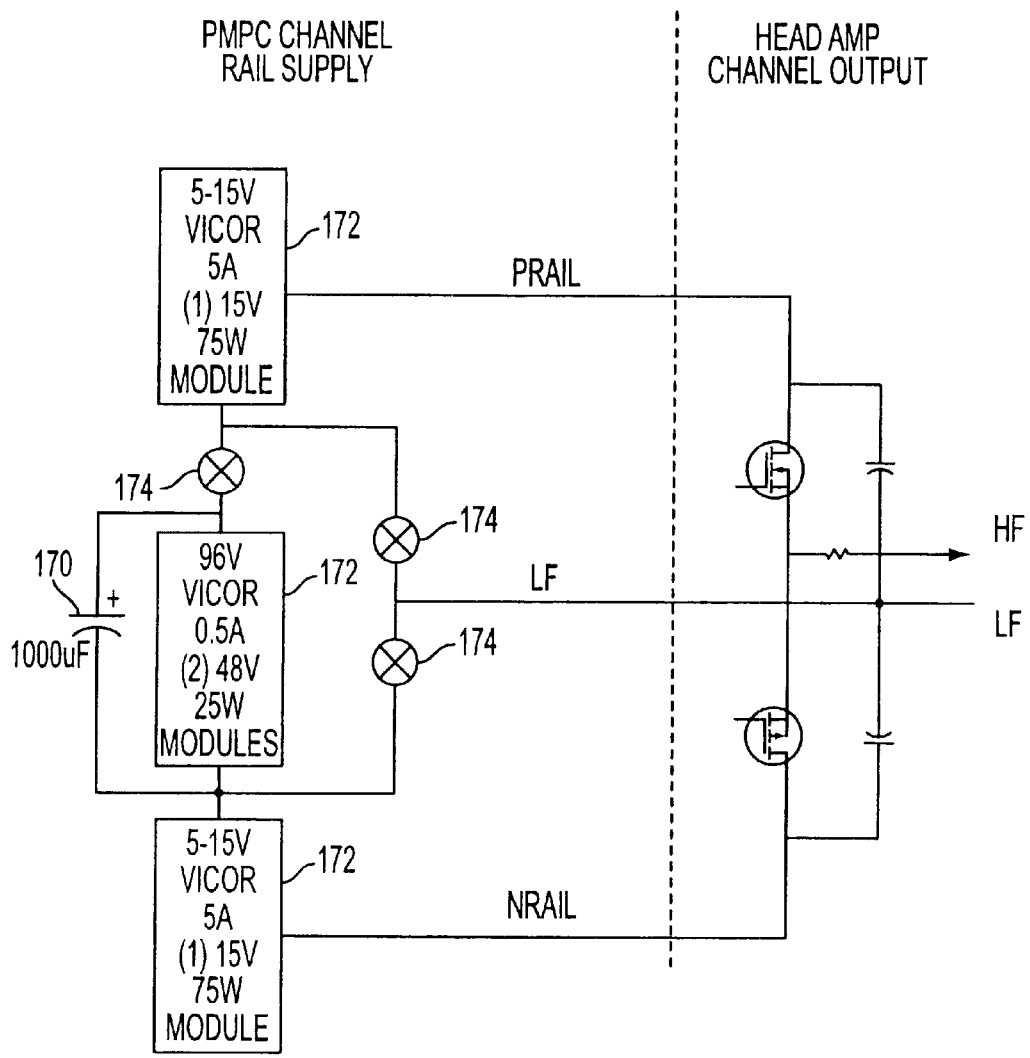
FIG. 9 shows the rail power supply subassembly that supplies the head amplifier.

The rail power supply subassembly 152 supply a power output to the head amplifier 154, as shown in FIG. 9. The rail power supply 152 uses an arrangement of commercially available power supplies 172 that is configurable via multiple switches 174 to form a variety of output configurations. For the CPS function described herein, the rail power supply subassembly 152 provides a relatively low voltage output of approximately +/−15 VDC. For the PPS function described herein, the rail power supply subassembly 152 can provide outputs to the head amplifier 154 of approximately −15 VDC and +111 VDC. Alternately, the rail power supply subassembly 152 can provide outputs to the head amplifier 154 of approximately −111 VDC and +15 VDC. In either the PPS or CPS mode, the rail power supply 152 and head amplifier 154 combination stores energy on a capacitor 170 so as to deliver pulsed power of up to 10 amps. Although in the exemplary embodiment, approximately 10 percent of the capacitor 170 resides in the head amplifier 154, and 90 percent resides in the rail power supply, other embodiments may locate the entire capacitor within the test head, or may utilize other advantageous distributions. Such an arrangement naturally limits average power dissipation. If the DUT draws too much average power, the capacitor discharges below a predetermined threshold. The rail power supply 152 monitors the voltage on the energy storage capacitor 170. If the voltage reaches the predetermined threshold, the head amplifier 152 reduces the ceiling on the current clamps to approximately 300 mA and reports an alarm. The actual energy level of the capacitor is available so that test conditions may be modified to provide the margin necessary to prevent discharging the capacitor to or below the threshold.

In order to implement the CPS mode of operation, one embodiment of the invention may include an energy storage element, e.g., a bypass capacitor, within the system to contribute to providing a constant "$V_{cc}$" type voltage output. This storage element is preferably located directly adjacent to the DUT, although other embodiments may locate the storage element further from the DUT.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A test system for testing at least one electrical component, comprising:
    a test head including a mounting assembly for removably attaching said electrical component, and a plurality of test ports for electrically coupling to said electrical component;
    a voltage and current source being disposed within said test head, constructed and arranged so as to (i) provide at least one electrical output, through an interface assembly, to said electrical component, said electrical output having a voltage magnitude within a predetermined voltage range and having a current magnitude within a predetermined current range, (ii) analyze said electrical output so as to detect and measure one or more changes to said electrical output caused by said electrical component, and (iii) receive and analyze a plurality of response signals through said interface assembly from said signal ports of said electrical component;
    wherein said at least one electrical output is characterized by a plurality of transitions and a predetermined-repetition rate between consecutive said transitions.

2. A test system according to claim 1, wherein said transitions include current transitions.

3. A test system according to claim 1, wherein said transitions include voltage transitions.

4. A test system according to claim 1, wherein said voltage and current source is disposed substantially adjacent to said electrical component, so as to minimize a length of said power interface assembly.

5. A test system according to claim 1, wherein said power interface assembly includes a cable assembly.

6. A test system according to claim 1, wherein said power interface assembly includes a printed circuit board assembly.

7. A test system according to claim 1, wherein said power supply is cooled by a liquid-based cooling system.

8. A test system according to claim 1, wherein said electrical output provided by said voltage and current source is characterized by an output profile with respect to time.

9. A test system according to claim 8, wherein said output profile includes variations in an output current.

10. A test system according to claim 8, wherein said output profile includes variations in an output voltage.

11. A test system according to claim 8, wherein a sequencer controls said electrical output such that said power output profile includes a contiguous series of discrete steps.

12. A test system according to claim 11, wherein said sequencer is initiated by an external trigger source from an associated control system, synchronous to a master reference clock.

13. A test system according to claim 11, wherein said sequencer controls an amplitude and a duration of each of said discrete steps.

14. A test system according to claim 11, wherein said sequencer includes a plurality of output profiles, one of which is selected by an associated control system.

15. A test system according to claim 1, further including a measurement output for providing an electrical measurement signal representative of a characteristic of said electrical output.

16. A test system according to claim 15, wherein said electrical output is periodically sampled at a sampling rate, such that said electrical measurement signal includes a sequence of digital words.

17. A test system according to claim 1, wherein said voltage and current source is electrically coupled to a mainframe system such that said voltage and current source functions as a remote extension of said mainframe system, and said mainframe system originates said electrical output, analyzes said electrical output, and analyzes said response signals.

18. A test system according to claim 1, said voltage and current source including an energy storage element, wherein said voltage and storage source directs energy from said storage element to said at least one electrical output.

19. A test system according to claim 18, said energy storage element being subdivided into a a first portion and a second portion, wherein said first portion resides within said test head and said second portion resides outside of said test head.

20. A test system for providing a repetitive, predetermined signal waveform to an electrical component, comprising:

a sequencer disposed within a test head, said sequencer constructed and arranged to produce a time varying control signal, corresponding to said predetermined signal waveform, as a result of an input trigger signal; and, a voltage and current source constructed and arranged to produce an electrical output that is a predetermined function of said control signal, said voltage and current source being electrically coupled to said electrical component so as to deliver said electrical output to said electrical component.

21. A test system according to claim 20, wherein said predetermined signal waveform includes a predetermined sequence of current transitions, so as to establish a contiguous series of current steps.

22. A test system according to claim 20, wherein said predetermined signal waveform includes a predetermined sequence of voltage transitions so as to establish a contiguous series of voltage steps.

23. A test system according to claim 20, wherein said sequencer is initiated by an external trigger source from an associated control system, synchronous to a master reference clock.

24. A test system according to claim 20, wherein said sequencer controls an amplitude of said predetermined signal waveform and a duration of each of a plurality of step intervals within said signal waveform.

25. A test system according to claim 20, wherein said sequencer includes a plurality of predetermined signal waveforms, one of which is selected by an associated control system.

26. A test system according to claim 20, farther including a measurement output for providing an electrical measurement signal representative of a magnitude of said predetermined signal waveform.

27. A test system according to claim 26, wherein said predetermined signal waveform is periodically sampled at a sampling rate, such that said electrical measurement signal includes a sequence of digital words.

* * * * *

UNITED STATES PATENT AND TRADEMARK OFFICE
CERTIFICATE OF CORRECTION

PATENT NO.     : 6,489,797 B1
DATED          : December 3, 2002
INVENTOR(S)    : Bruce MacDonald et al.

It is certified that error appears in the above-identified patent and that said Letters Patent is hereby corrected as shown below:

<u>Title page, Item [54] and Column 1, lines 1-5,</u>
Should read -- TEST SYSTEM INCLUDING A TEST HEAD WITH INTEGRAL DEVICE FOR GENERATING AND MEASURING OUTPUTS HAVING VARIABLE CURRENT AND/OR VOLTAGE CHARACTERISTICS --.

Signed and Sealed this

Twenty-seventh Day of May, 2003

JAMES E. ROGAN
*Director of the United States Patent and Trademark Office*